(12) United States Patent
Ching et al.

(10) Patent No.: US 10,163,731 B2
(45) Date of Patent: Dec. 25, 2018

(54) FINFET SEMICONDUCTOR STRUCTURE HAVING HYBRID SUBSTRATE AND METHOD OF FABRICATING THE SAME

(71) Applicant: TAIWAN SEMICONDUCTOR MANUFACTURING CO., LTD., Hsinchu (TW)

(72) Inventors: Kuo-Cheng Ching, Hsinchu County (TW); Ching-Wei Tsai, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/485,428

(22) Filed: Apr. 12, 2017

(65) Prior Publication Data
US 2018/0301384 A1  Oct. 18, 2018

(51) Int. Cl.
| | |
|---|---|
| *H01L 21/84* | (2006.01) |
| *H01L 29/04* | (2006.01) |
| *H01L 27/13* | (2006.01) |
| *H01L 23/00* | (2006.01) |
| *H01L 27/12* | (2006.01) |

(Continued)

(52) U.S. Cl.
CPC ...... *H01L 21/845* (2013.01); *H01L 21/76275* (2013.01); *H01L 21/76283* (2013.01); *H01L 24/32* (2013.01); *H01L 27/1207* (2013.01); *H01L 27/1211* (2013.01); *H01L 27/13* (2013.01); *H01L 29/045* (2013.01); *H01L 21/823807* (2013.01); *H01L 2224/32148* (2013.01)

(58) Field of Classification Search
CPC ............ H01L 21/76283; H01L 21/845; H01L 21/76275; H01L 27/1211; H01L 27/1207; H01L 27/13
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |

(Continued)

*Primary Examiner* — Dung Le
(74) *Attorney, Agent, or Firm* — McClure, Qualey & Rodack, LLP

(57) ABSTRACT

A FinFET semiconductor structure includes first fins and second fins extended from a semiconductor substrate, and a gate structure disposed over the first fins and the second fins. Each first fin includes a first semiconductor portion connected to the semiconductor substrate and a second semiconductor portion over the semiconductor substrate. Each second fin includes the first semiconductor portion connected to the semiconductor substrate, the second semiconductor portion, and at least one spacer at least partially disposed between the first semiconductor portion and the second semiconductor portion. The semiconductor substrate and the first semiconductor portion respectively have a surface oriented on a first crystal plane, the second semiconductor portion has a surface oriented on a second crystal plane, wherein the first crystal plane is oriented differently than the second crystal plane.

20 Claims, 12 Drawing Sheets

(51) Int. Cl.
*H01L 21/762* (2006.01)
*H01L 21/8238* (2006.01)

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,570,590 B1 * | 2/2017 | Doris ................ H01L 29/66795 |
| 9,576,814 B2 | 2/2017 | Wu et al. |
| 9,728,464 B2 * | 8/2017 | Glass .............. H01L 21/823807 |
| 2007/0158730 A1 * | 7/2007 | Burnett ............... H01L 27/1108 257/314 |
| 2016/0035872 A1 * | 2/2016 | Loubet .................. H01L 29/785 257/347 |
| 2016/0218215 A1 * | 7/2016 | Doris .................. H01L 27/0924 |

* cited by examiner

FINFET SEMICONDUCTOR STRUCTURE HAVING HYBRID SUBSTRATE AND METHOD OF FABRICATING THE SAME

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, with FinFET devices scaling down, there is a risk to scale fin width for short channel effect, which suffered serious mobility degradation. Therefore, to facilitate scaling of CMOS dimensions, while maintaining an acceptable performance, there is a need to increase the mobility of carriers in a semiconductor material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
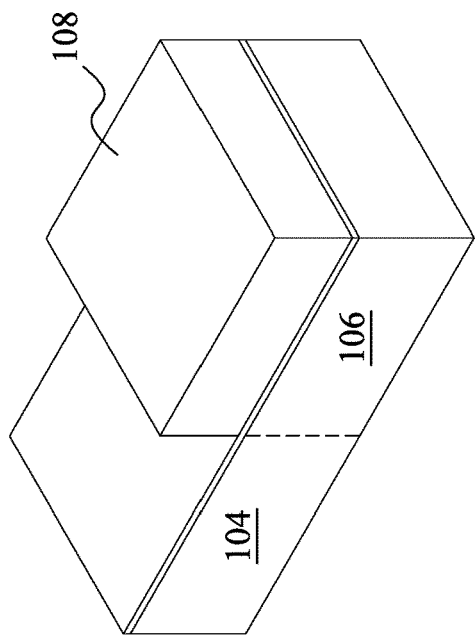
FIGS. 1-11 are perspective views of a fin field effect transistor (FinFET) device at various stages of fabrication according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1-11 are perspective views of a fin field effect transistor (FinFET) device at various stages of fabrication according to various embodiments of the present disclosure. A completed FinFET device may be fabricated using complementary metal-oxide-semiconductor (CMOS) technology processing. Accordingly, it is understood that additional processes may be provided before, during, and after the fabrication, and that some other processes may only be briefly described herein. Also, FIGS. 1-11 are simplified for a better understanding of the concepts of the present disclosure.

Figure 1:
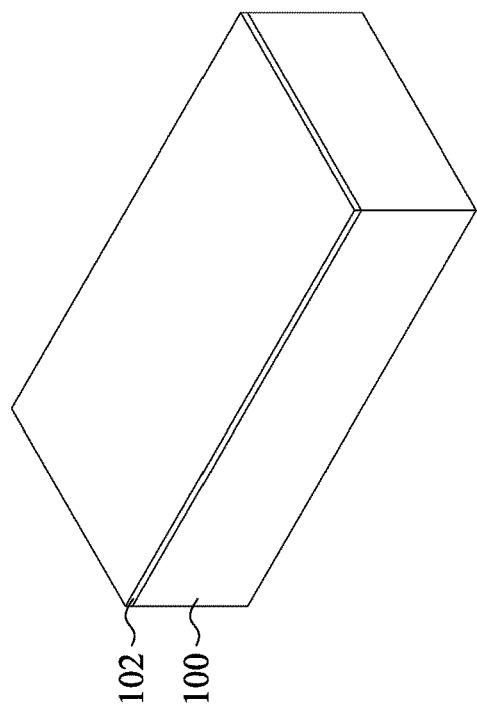

Referring to FIG. 1, the fabrication begins at forming a first oxide layer 102 on a first semiconductor substrate 100. In some embodiments, the first semiconductor substrate 100 includes a crystal silicon material, and the first oxide layer 102 is a silicon oxide layer. It is understood that the first semiconductor substrate 100 may include other suitable materials in alternative embodiments. The first semiconductor substrate 100 has a surface oriented on a (100) crystal plane. The semiconductor substrate 100 having a surface oriented on the (100) crystal plane is chosen because the surface state density between the silicon substrate and the silicon oxide layer is at a minimum when the silicon substrate surface is oriented on the (100) plane. Furthermore, the mobility of electrons in the (100) plane is higher than in other crystal planes.

The planes are defined by the "Miller Indices" methodology, which provides a conventional method to specify planes and direction in a silicon crystal. Common orientations classified by the "Miller indices" are (100), (011), (110), and (111). The orientation of the wafer is classified by which orientation plane the surface of the wafer is parallel to. The surface might not be exactly parallel, but slightly different, and the difference is called the displacement angle or the off angle orientation. The relationship between the crystal orientation and the radius can be marked by either a notch or a flat cut into the wafer.

Reference is made to FIG. 2. The semiconductor substrate 100 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic;

and/or combinations thereof. The fabrication includes performing one or more doping processes, such as implantation processes to form an opposite type well in the first semiconductor substrate 100. In some embodiments, the first semiconductor substrate 100 is an N-type substrate, and a P-type doping process is performed to form a P-type well 104 in the first semiconductor substrate 100. The portion of an N-type well 106 is protected by a mask 108 during the doping process. After the P-type well 104 and the N-type well 106 are formed in the first semiconductor substrate 100, the mask 108 is removed.

Figure 3:
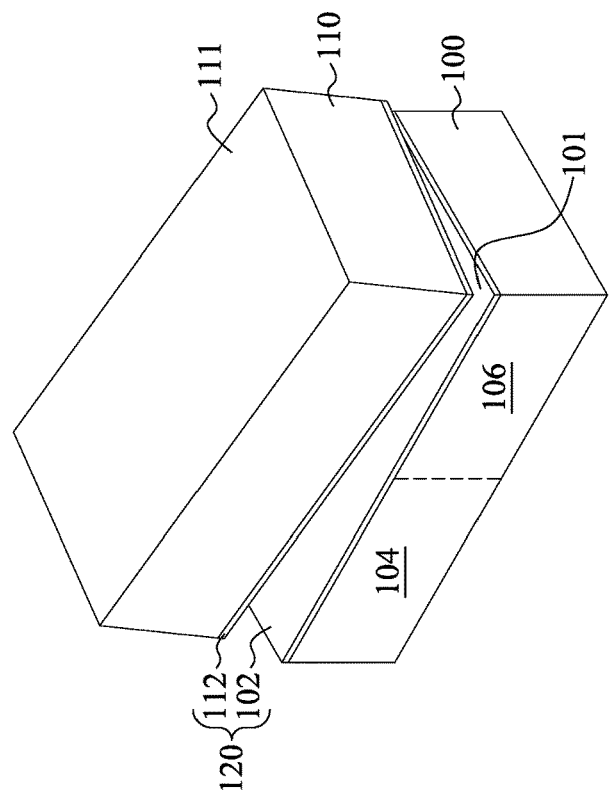

Reference is made to FIG. 3. A second semiconductor substrate 110 is bonded onto the first semiconductor substrate 100. The second semiconductor 110 includes a crystal silicon material. It is understood that the second semiconductor substrate 110 may include other suitable materials in alternative embodiments. The second semiconductor substrate 110 has a surface oriented on crystal plane different from a (100) crystal plane. That is, the first semiconductor substrate 100 and the second semiconductor substrate 110 orient on different crystal planes, respectively. For example, the first semiconductor substrate 100 has a surface, such as the major surface 101, oriented on a first crystal plane, such as the plane (100), and the second semiconductor substrate 110 has a surface, such as the major surface 111, oriented on a second crystal plane, in which the second crystal plane is different from the first crystal plane. The surface oriented on the first crystal plane, e.g. the major surface 101 is substantially parallel to the surface oriented on the second crystal plane, e.g. the major surface 111. In some embodiments, the second crystal plane is a (110) crystal plane, or a (100) crystal plane rotating 45 degrees.

In some embodiments, a second oxide layer 112 is formed on a surface of the second semiconductor substrate 110, and the first semiconductor substrate 100 and the second semiconductor substrate 110 are bonded at the surfaces on where the first and second oxide layers 102, 112 are formed. The first and second oxide layers 102, 112 are combined and become an oxide layer 120 between the first semiconductor substrate 100 and the second semiconductor substrate 110. The oxide layer 120 is disposed between and bridges the first semiconductor substrate 100 and the second semiconductor 110, such that the interface between the first semiconductor substrate 100 and the second semiconductor substrate 110 is uniform and does not have a specific crystal plane. Thus the defects raised at the interface between different orientations can be prevented.

Figure 4:
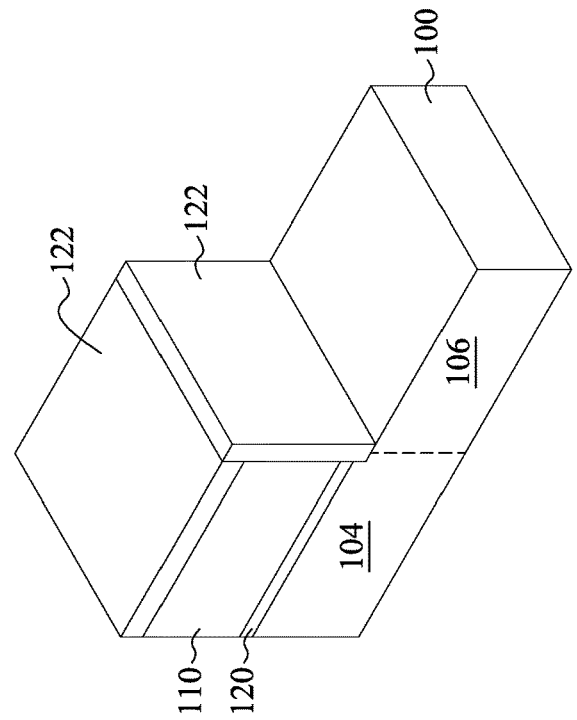

Reference is made to FIG. 4. The portion of the second semiconductor substrate 110 and the oxide layer 120 above N-type well 106 is removed, and the N-type well 106 is exposed from the second semiconductor substrate 110. The removing process includes forming a mask protecting the portion of the second semiconductor substrate 110 above the P-type well 104, performing a suitable etching process to remove the uncovered portion of the second semiconductor substrate 110, and removing the mask. After the removing process, an additional oxide layer 122 is further formed on the top surface and the side surface of the remaining second semiconductor substrate 110.

Figure 5:
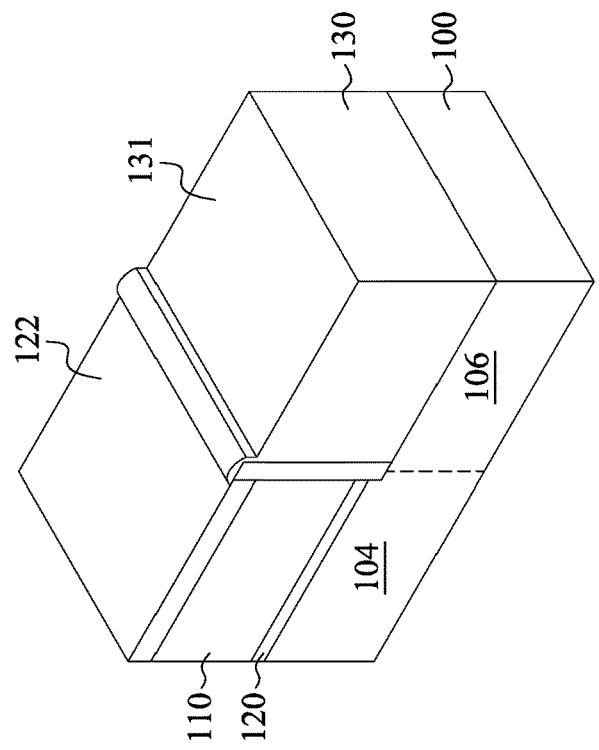

Reference is made to FIG. 5. A third semiconductor substrate 130 is formed on the exposed portion of the first semiconductor substrate 100. The material of the third semiconductor substrate 130 is chosen to form P-type devices. In some embodiments, the material of the third semiconductor substrate 130 includes SiGe or other suitable materials. In some embodiments, the third semiconductor substrate 130 has a surface, such as the major surface 131, oriented on the first crystal plane, such as the plane (100). The major surface 131 is substantially parallel to the major surfaces of the first semiconductor substrate 100 and the second semiconductor substrate 110. In some embodiments, the third semiconductor substrate 130 is epitaxially grown on the exposed portion of the first semiconductor substrate 100.

Figure 6:
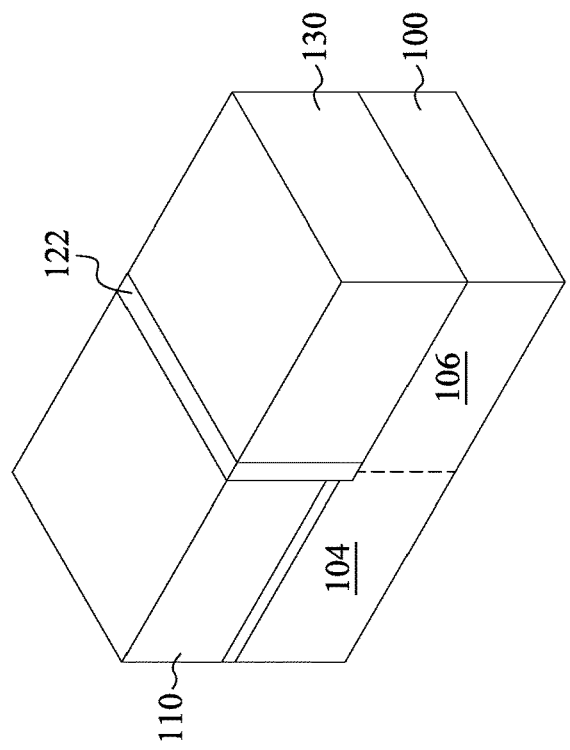

Reference is made to FIG. 6. A surface flattening process is performed to flatten the top surfaces of the second semiconductor substrate 110 and the third semiconductor substrate 130. The top surface of the second semiconductor substrate 110 and the top surface of the third semiconductor substrate 130 are substantially at the same level. The oxide layer 122, which is regarded as a boundary between the second semiconductor substrate 110 and the third semiconductor substrate 130 is not covered by the third semiconductor substrate 130. In some embodiments, the flattening process includes performing a polishing process, such as a chemical mechanical polishing (CMP) process.

Figure 7:
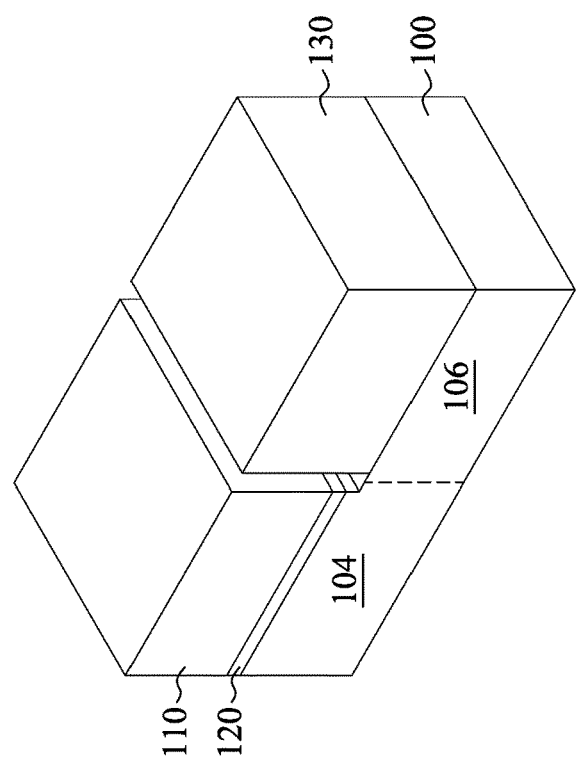

Reference is made to FIG. 7. The oxide layer 122 between the second semiconductor substrate 110 and the third semiconductor substrate 130 is removed. Thus a through is formed between the second semiconductor substrate 110 and the third semiconductor substrate 130. In some embodiments, a capping layer is optionally formed on the second semiconductor substrate 110 and the third semiconductor substrate 130.

Figure 8:
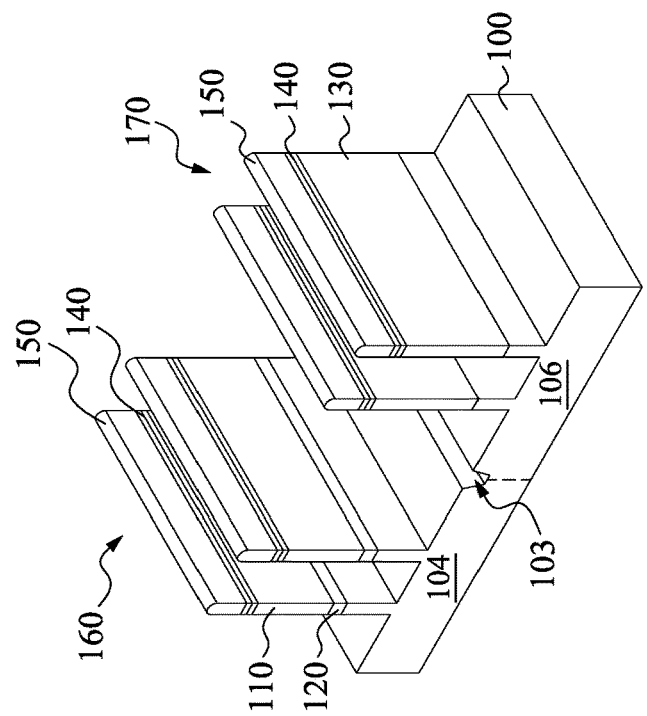

Reference is made to FIG. 8. The first semiconductor substrate 100, the second semiconductor substrate 110 and the third semiconductor substrate 130 are patterned to form a plurality of fin structures on the first semiconductor substrate 100. In some embodiments, a mask layer 150, such as a photoresist layer, is formed on capping layer 140. The mask layer 150 is patterned by a lithography process to form a plurality of features and a plurality of openings defined by the features on the capping layer 140. The lithography process may include photoresist coating, exposing, post-exposure baking, and developing. Portions capping layer 140 exposed by the mask layer 150 are removed by suitable etching process. Then, an additional etching process, such as an anisotropic etching process is performed to pattern the second semiconductor substrate 110 and the third semiconductor substrate 130.

Figure 9:
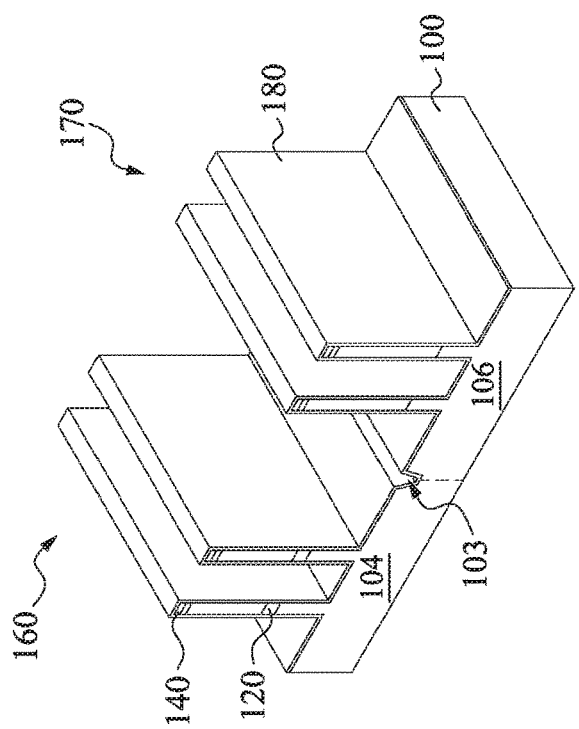

The fin structures include a plurality of first fins 160 on the P-type well 104, and a plurality of second fins 170 on the N-type well 106. The first fins 160 are utilized to form N-type FinFET device devices, and the second fins 170 are utilized to form P-type FinFET device devices. In some embodiments, a notch 103 is formed on the first semiconductor substrate 100 and between the first fins 160 and the second fins 170 after the patterning process. Then, a liner 180 is formed on the top and side surfaces of the first fins 160, the second fins 170, and the first semiconductor substrate 100, the structure after forming the liner 180 is shown in FIG. 9. The liner 180 can be formed by any suitable material and deposition processes. In some embodiments, the liner 180 is a silicon liner.

Figure 10:
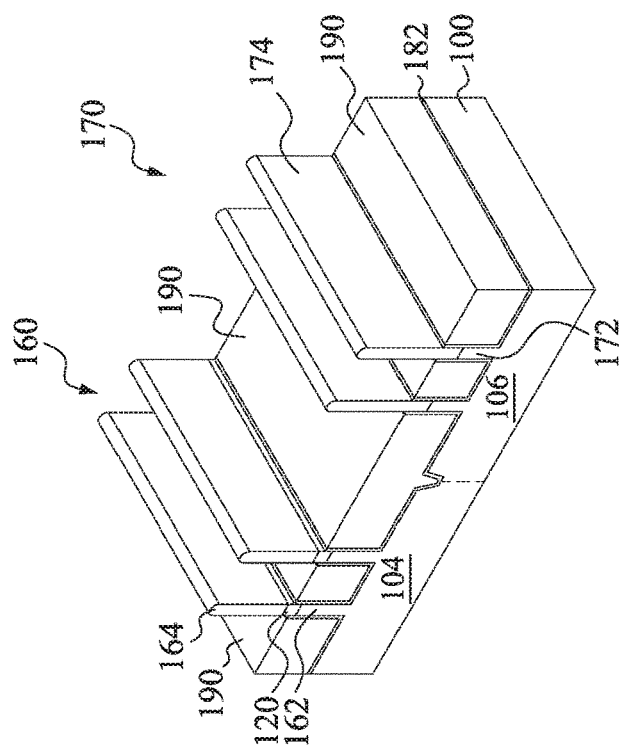

Reference is made to FIG. 10. In some embodiments, the silicon liner 180 (referring to FIG. 9) is treated and becomes, such as a silicon nitride liner 182. The silicon nitride liner 182 is denser than the silicon liner 180. The silicon nitride liner 182 can improve characteristics of high density FinFET devices. After the silicon nitride liner 182 is formed, a dielectric material is deposited and fills the spaces between the first fins 160 and second fins 170. Then a recessing process is performed to form a plurality of isolation structures 190 between the first fins 160 and the second fins 170.

In some embodiments, the isolation structures 190 are shallow trench isolations (STI). The isolation structures 190 are made of dielectric material, such as silicon oxide, silicon nitride, silicon oxynitride, fluoride-doped silicate glass (FSG), a low-k dielectric material, and/or other suitable insulating material.

In some embodiments, portions of the silicon nitride liner 182 are removed during the recessing process, such that the first fins 160 and the second fins 170 above the isolation structures 190 are not covered by the silicon nitride liner 182. The first fins 160 are formed on the P-type well 104 and can be utilized for N-type FinFET devices. The second fins 170 are formed on the N-type well 106 and can be utilized for P-type FinFET devices.

In some embodiments, each of the first fins 160 includes a first semiconductor portion 162 connected to the P-type well 104, a second semiconductor portion 164 over the P-type well 104, and the oxide layer 120 between the first semiconductor portion 162 and the second semiconductor portion 164. The first semiconductor portion 162 is a portion of the first semiconductor substrate and has a first crystal plane, the second semiconductor portion 164 is a portion of the second semiconductor substrate and has a second crystal plane, and the first crystal plane is oriented differently than the second crystal plane.

In some embodiments, each of the second fins 170 includes a first semiconductor portion 172 connected to the N-type well 106, and a third semiconductor portion 174 connected to the first semiconductor portion 172. The first semiconductor portion 17 is a portion of the first semiconductor substrate and has a first crystal plane, the third semiconductor portion 174 is a portion of the third semiconductor substrate and has a third crystal plane, and the first crystal plane and the third crystal plane may have the same orientation.

Figure 12:
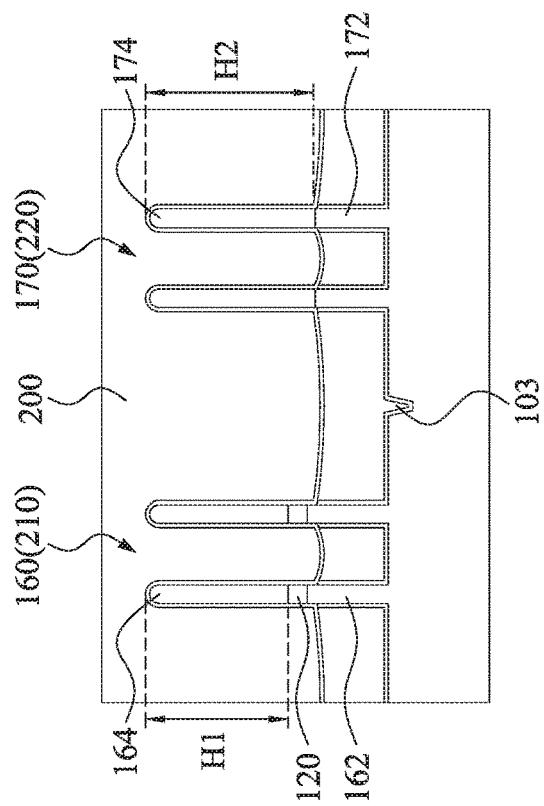
FIG. 12 is a cross-sectional view taken along line 12-12 of FIG. 11.
Figure 11:
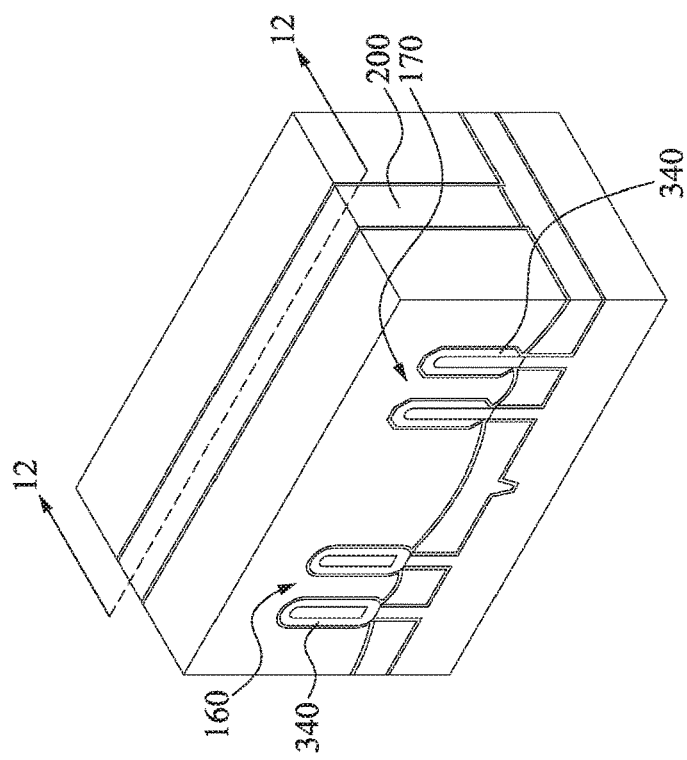

Reference is made to FIG. 11 and FIG. 12, in which FIG. 12 is a cross-sectional view taken along line 12-12 of FIG. 11. FIG. 11 is a device schematic view using the structure of claim 10, in which a gate structure 200 is formed crossing over the first fins 160 and the second fins 170. The device includes N-type FinFET devices 210 including the first fins 160 and the P-type FinFET devices 220 including the second fins 170. The portion of the first and second fins 160 and 170 crossed over by the gate structure 200 can be regarded as channel region of the FinFET devices, and the portions of the first and second fins 160 at opposite sides of the gate structures 200 can be regarded as source/drain regions of the FinFET devices.

Regarding to FIG. 12, the height H2 of the third semiconductor portions 174 of the second fins 170 is longer than the height H1 of the second portions 164 of the first fins 160. Therefore, the height of the channel regions of the P-type FinFET devices 220 (e.g. the height H2) is longer than the height of the channel regions of the N-type FinFET devices 210 (e.g. the height H1). The height difference between H1 and H2 is substantially equals to the thickness of the oxide layer 120.

FIGS. 13-19B are perspective views and cross-sectional views of N-type FinFET devices at various stages of fabrication according to various embodiments of the present disclosure, in which FIG. 13-19B are stages follow after FIG. 10. The first fins 160 includes a first group of fins 160a and a second group of fins 160b, in which the fins 160a are utilized to form passive components, such as inductors, capacitors, diodes, BJTs, and the fins 160b are utilized to form logic components in a logic circuit, such as AND, OR, INV, NAND, NOR, XOR, and XNOR logic circuits.

Figure 13:
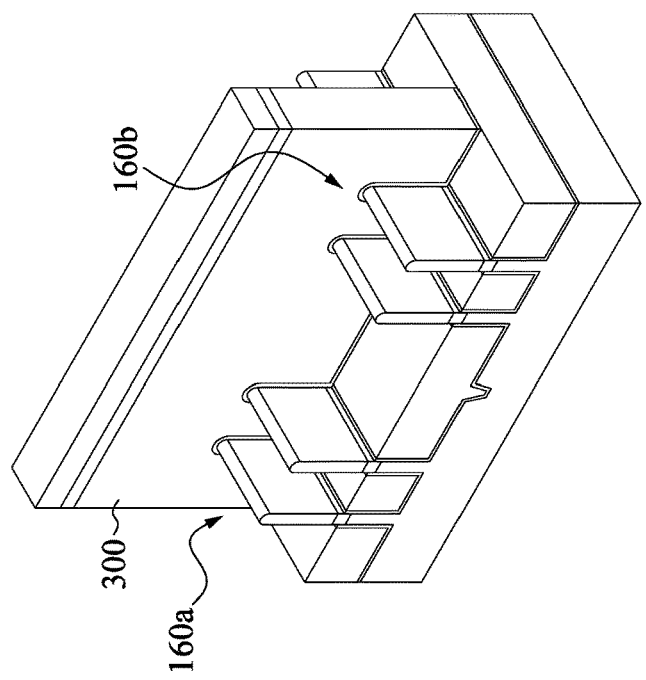

Referring to FIG. 13, a poly gate structure 300 is formed on and crosses over the fins 160a and 160b. The poly gate structure 300 can be made by, for example, depositing a polysilicon layer covering the fins 160a and 160b, and patterning the polysilicon layer. In some embodiments, the poly gate structure 300 covers the middle portion of the fins 160a and 160b, and the portions of the fins 160a and 160b crossed over by the poly gate structure 300 are regarded as channel regions. The portions of the fins 160a and 160b at opposite sides of the poly gate structure 300 are regarded as source/drain regions.

Figure 14:
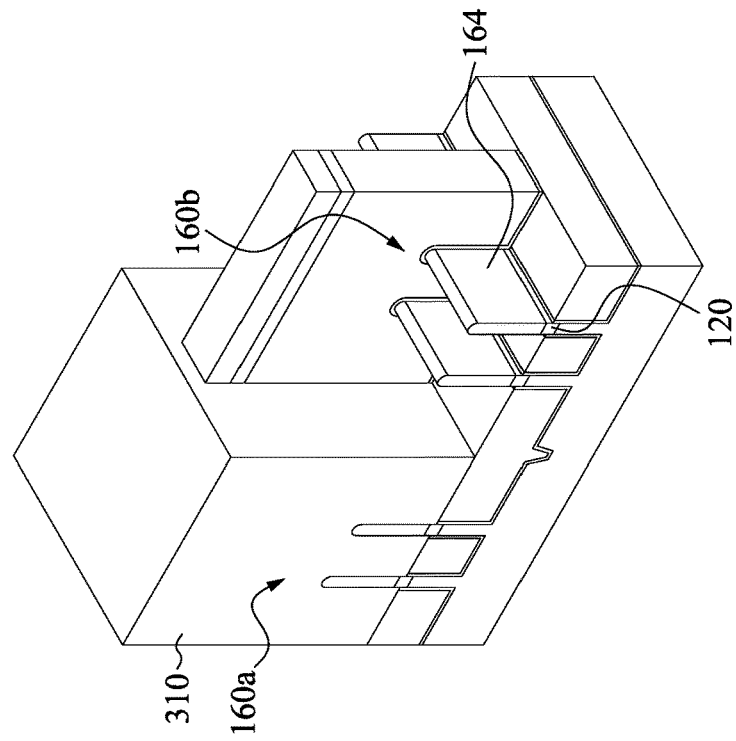
FIGS. 13-19B are perspective views and cross-sectional views of N-type FinFET devices at various stages of fabrication according to various embodiments of the present disclosure.

Reference is further made to FIG. 14. A mask layer 310, such as a photoresist layer is formed on the fins 160a, and the fins 160b are not covered by the mask layer 310. That is, the fins 160a for the passive components are protected by the mask layer 310, and the fins 160b for the logic components are exposed by the mask layer 310. In some embodiments, the second semiconductor portion 164 and the oxide layer 120 of the fins 160b are not protected by the mask layer 310.

Figure 15B:
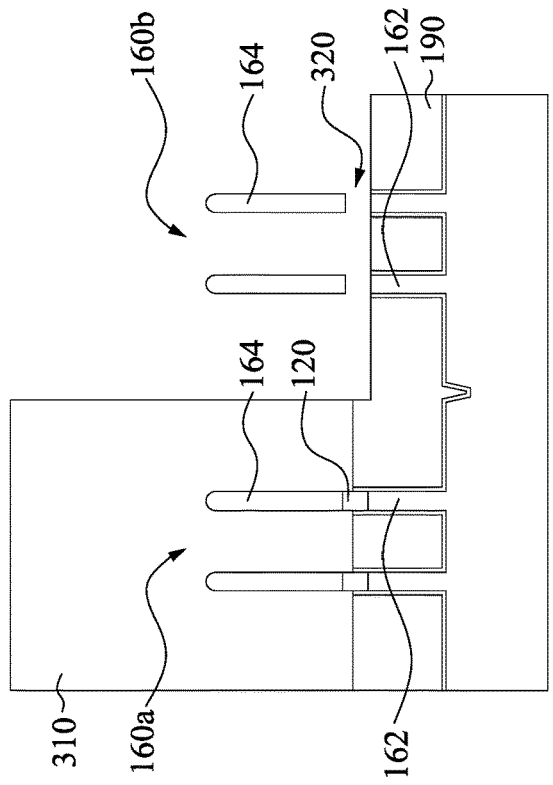
Figure 15A:
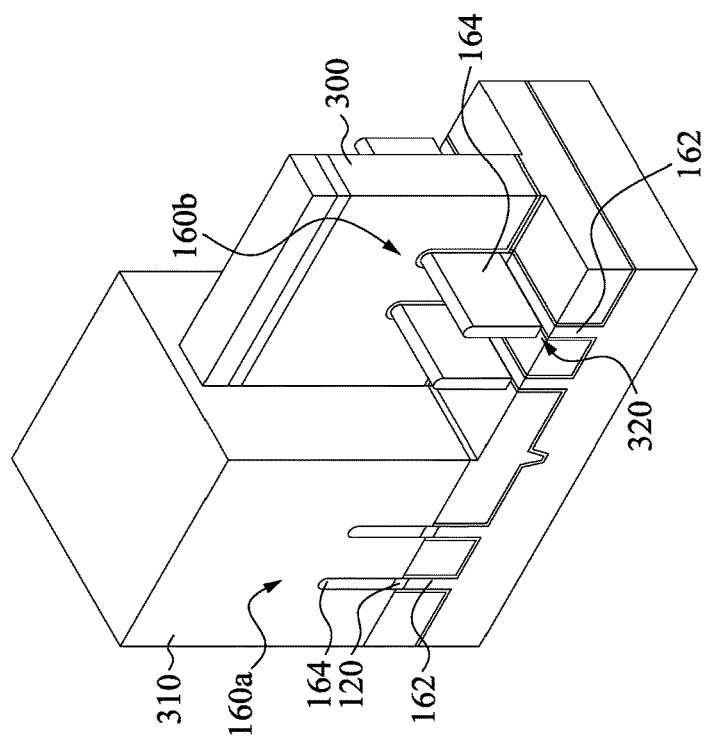

Reference is made to FIGS. 15A and 15B. A chemical oxide reaction process is performed to remove the oxide layer 120 at source/drain regions of the fins 160b, and the oxide layer 120 at the fins 160a is still remained. The chemical oxide reaction process can be such as a CERTAS® etch, a DHF treatment, combinations thereof, or the like. After the chemical oxide reaction process is performed, a plurality gaps 320 are formed between the first semiconductor portions 162 and the second semiconductor portions 164 of the fins 160b. On the other hand, portions of the oxide layer 120 at the channel regions of the fins 160b are covered by the poly gate structure 300 and are still remained. In some embodiments, the upper portion of the isolation structures 190 is removed during the chemical oxide reaction process, and the top surface of the first semiconductor portions 162 of the fins 160b and the top surface of some of the isolation structures 190 may be substantially at the same level. The mask layer 310 is removed after the gaps 320 are formed at bottom of the fins 160b.

Figure 16B:
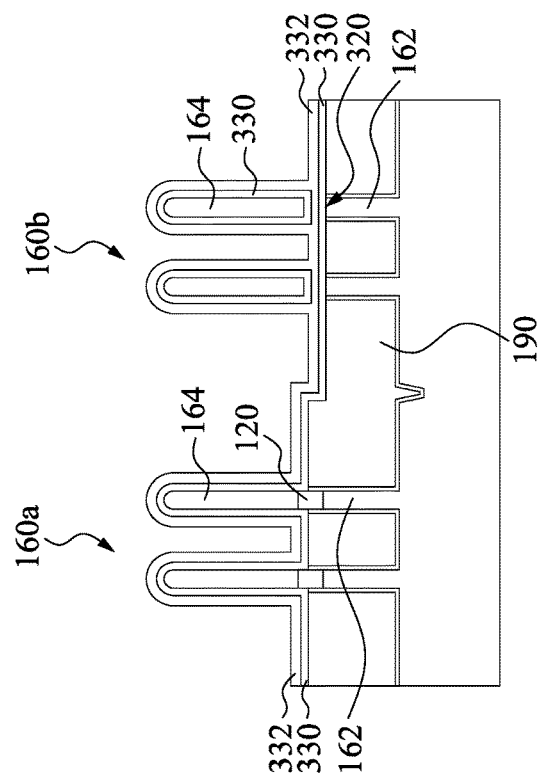
Figure 16A:
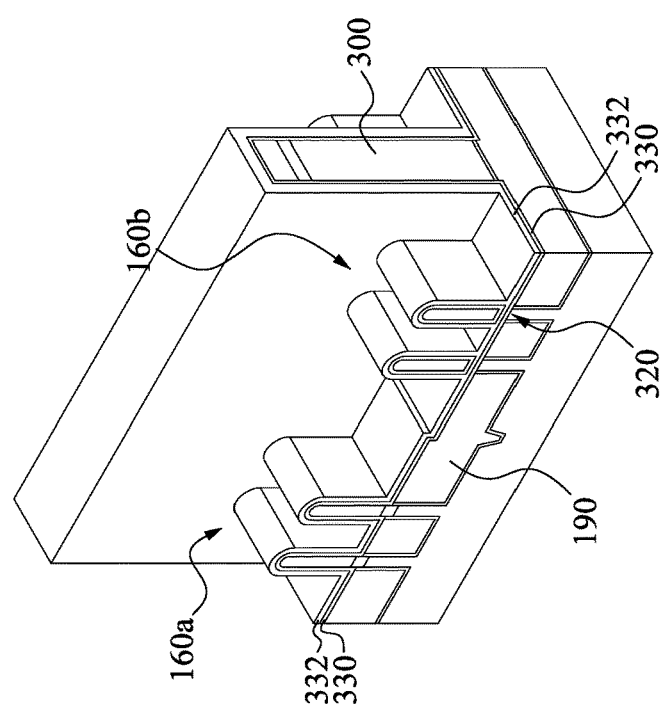

Reference is made to FIGS. 16A and 16B. A plurality of spacers 330, 332 are deposited on the fins 160a, 160b, and on the isolation structures 190. The spacers 330, 332 can be sequentially deposited on the first fins 160a, the second fins 160b, the isolation structures 190, and on the poly gate structure 300 as gate spacers. The spacers 330, 332 may have different characteristics. The materials and the thickness of the spacers 330, 332 can be different. In some embodiments, the spacers 330, 332 can be nitride layer, such as a silicon nitride layer.

In some embodiments, the spacers 330, 332 are filled in the gaps 320 at the second fins 160b. The spacers 330, 332 are arranged surrounding the source/drain regions of the second fins 160b, and the source/drain regions of the first fins 160a are surrounded by the spacers 330, 332, and the oxide layer 120. That is, at the source/drain regions of the first fins 160a, the first semiconductor portions 162 and the second semiconductor portions 164 are connected by the oxide layer 120. On the other hand, at the source/drain regions of the second fins 160b, the first semiconductor portions 162 and the second semiconductor portions 164 are connected by the spacers 330, 332.

Figure 17B:
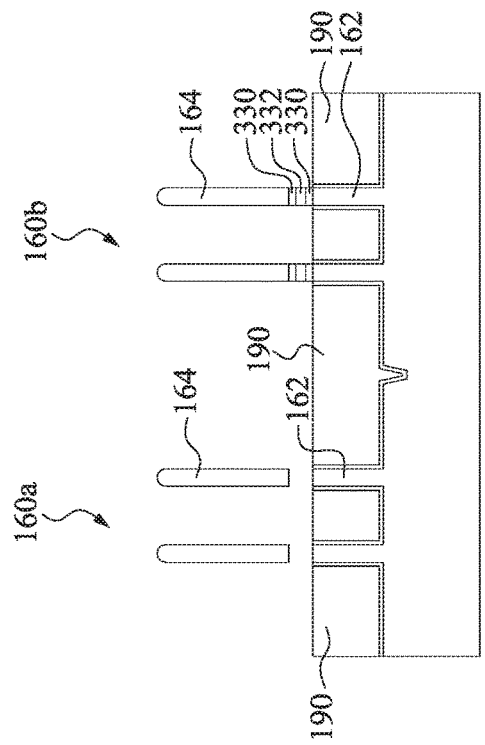
Figure 17A:
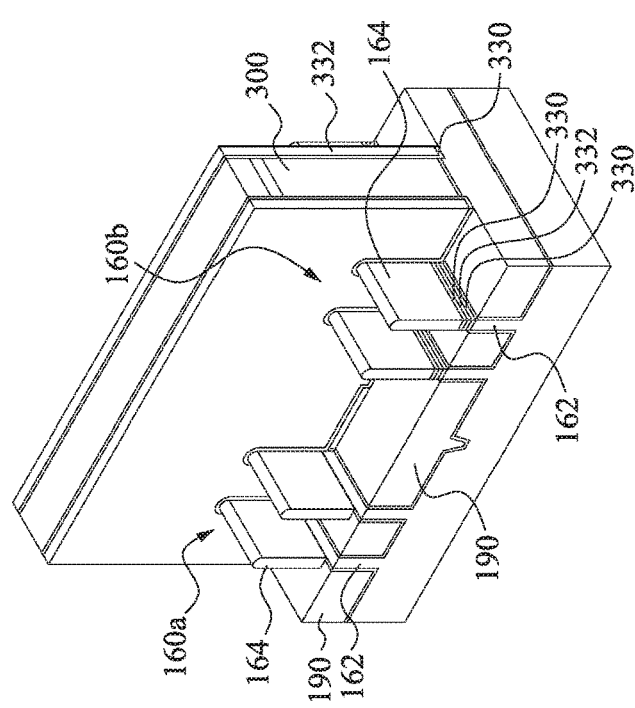

Reference is made to FIGS. 17A and 17B. A pulling back process is performed to remove portions of the spacers 330, 332. In some embodiments, the pulling back process is an anisotropic etching process. Therefore, after the pulling back process, the portions of the spacers 330, 332 on the top surface of the poly gate structure 300 are removed; the portions of the spacers 330, 332 on the top and side surfaces of the first and second fins 160a, 160b are removed; the portions of the spacers 330, 332 on the top surfaces of the isolation structures 190 are removed; the portions of the spacers 330, 332 between the first semiconductor portions 162 and second semiconductor portions 164 of the second fins 160b are remained; the portions of the oxide layer 120 between the first semiconductor portions 162 and the second semiconductor portions 164 of the first fins 160a are remained.

After the pulling back process is performed, a cleaning process is performed. In some embodiments, an acidic chemical can be utilized in the cleaning process. For example, a wet clean through the utilization of HCl or the diluted hydrofluoric acid (DHF) is carried out to remove polymer from the surface of the structure. In some embodiments, the oxide layer 120 uncovered by the poly gate structure 300 is removed during the cleaning process, and the spacers 330, 332 are still remained after the cleaning process.

Figure 18B:
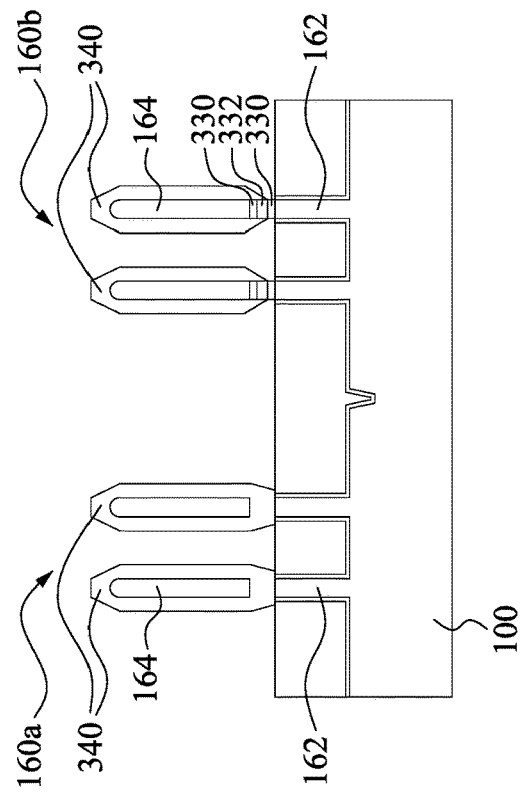
Figure 18A:
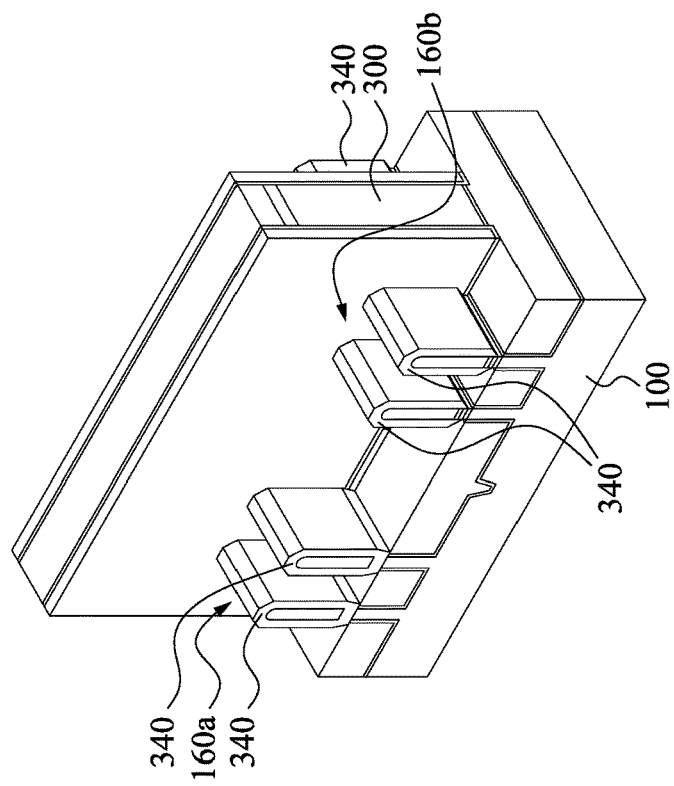

Reference is made to FIGS. 18A and 18B. The structure depicted in FIGS. 18A and 18B are produced by selectively growing epitaxial layers 340 covering the source/drain regions of the first fins 160a and the second fins 160b. Since the lattice constant of the epitaxial layers 340 is different from the first fins 160a and the second fins 160b, the channel regions of the first fins 160a and the second fins 160b are strained or stressed to enable carrier mobility of the device and enhance the device performance. The source/drain regions are portions of the first fins 160a and the second fins 160b not covered by the poly gate structure 300, and the channel regions are the portions of the first fins 160a and the second fins 160b covered by the poly gate structure 300.

In some embodiments, the epitaxial layers 340 surround the second semiconductor portions 164 of the first fins 160a exposed by the poly gate structure 300, and the epitaxial layers 340 connect the second semiconductor portions 164 of the first fins 160a to the first semiconductor substrate 100. In some embodiments, the epitaxial layers 340 cover the second semiconductor portions 164 of the second fins 160b exposed by the poly gate structure 300, and the spacers 330, 332 are disposed between the epitaxial layers 340 and the first semiconductor portions 162 of the second fins 160b.

In some embodiments, the growth of the epitaxial layers 340 over the first fins 160a and the second fins 160b continue until the epitaxial layers 340 vertically extend above and laterally extend from the first fins 160a and the second fins 160b. In some embodiments, the epitaxial layers 340 may comprise a single layer or multilayer structure. In the single-layer embodiment, the epitaxial layers 340 may comprise a silicon-containing material. In some embodiments, the epitaxial layers 340 such as silicon carbon (SiC), are epi-grown by a LPCVD process to form the source/drains of the n-type FinFET devices. The LPCVD process is performed at a temperature of about 400° to 800° C. and under a pressure of about 1 to 200 Torr, using $Si_3H_8$ and $SiH_3CH$ as reaction gases. In some other embodiments, the epitaxial layers, such as silicon germanium (SiGe), is epi-grown by a LPCVD process to form the source/drains of the p-type FinFET devices. The LPCVD process is performed at a temperature of about 400° to 800° C. and under a pressure of about 1 to 200 Torr, using $SiH_4$ and $GeH_4$ as reaction gases.

In the multilayer embodiment, the epitaxial layers 340 may further comprise a II-VI semiconductor material or a III-V semiconductor material between the silicon-containing material and the source/drain regions the first fins 160a and the second fins 160b. In some embodiments, the II-VI semiconductor material comprises a material selected from the group consisting of ZeSe, ZnO, CdTe, and ZnS. In some embodiments, the III-V semiconductor material comprises a material selected from the group consisting of GaAs, InAs, InGaAs, AlAs, AlGaAs, InP, AlInP, InGaP, GaN, AlGaN, InN, InGaN, InSb, InGaAsSb, InGaAsN, and InGaAsP.

Figure 19B:
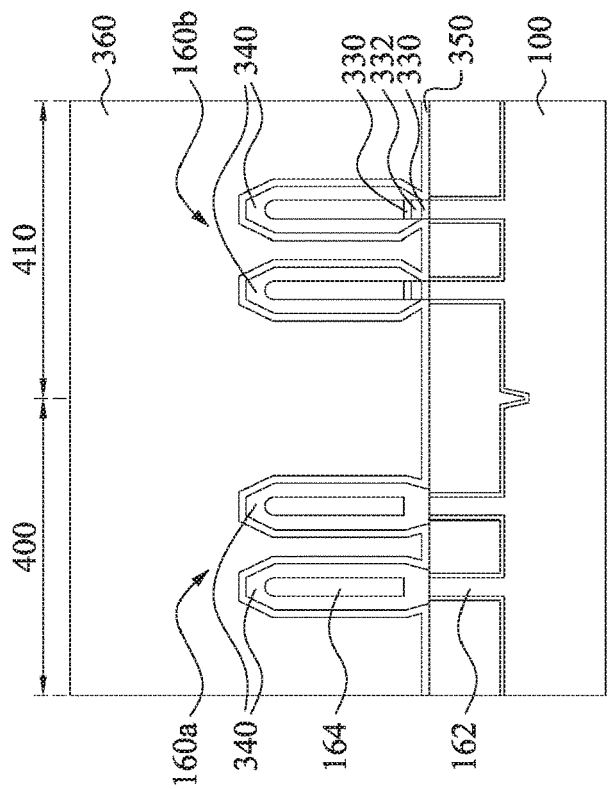
Figure 19A:
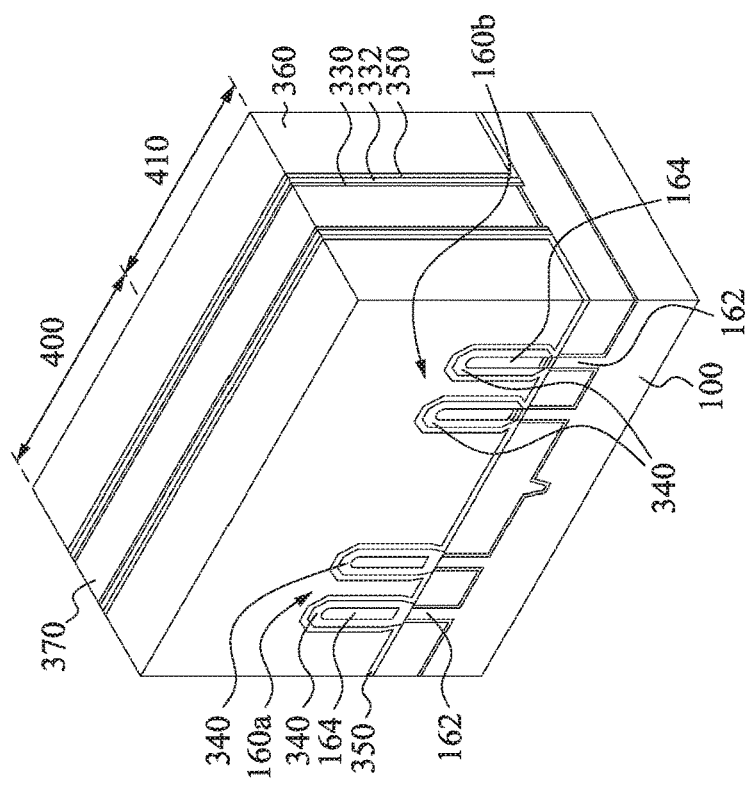

Reference is made to FIGS. 19A and 19B. After the epitaxial layers 340 are formed cladding the first fins 160a and the second fins 160b, a contact etch stop layer 350 is deposited on the first fins 160a, the second fins 160b, the isolation structures 190, and the poly gate structure 300. Next, a flowable chemical vapor deposition (FCVD) is carried out to form an interlayer dielectric (ILD) layer 360 on the contact etch stop layer 350. A planarizing process, such as a chemical mechanical polishing (CMP) process is performed to partially remove the interlayer dielectric layer 360, the contact etch stop layer 350, and the hard mask on the poly gate structure 300, so that the top of the gate electrode composed of polysilicon within the poly gate structure 300 is exposed and substantially even with the surface of the interlayer dielectric layer 360. Alternatively, another approach could be utilized by first performing a CMP process to partially remove the interlayer dielectric layer 360 until reaching the contact etch stop layer 350, and then using a dry etching process to partially remove the interlayer dielectric layer 360, the contact etch stop layer 350, and the hard mask for exposing the top of the gate electrode of the poly gate structure.

A replacement metal gate (RMG) process is further conducted to form a metal gate 370 in each of the P-type FinFET device region (not shown) and the N-type FinFET device region, in which each metal gate 370 includes a high-k dielectric layer and a work function metal layer. According to some embodiments, the replacement metal gate process could be carried out by first performing a selective dry etching or wet etching process, such as using etchants including ammonium hydroxide ($NH_4OH$) or tetramethyl-ammonium hydroxide (TMAH) to remove the polysilicon layer from the poly gate structure 300 without etching the interlayer dielectric layer 360 and the spacers 330, 332 for forming a recess between the spacers 330, 332. The high-k dielectric layer and adequate work function metal layer are deposited into the recess, and the high-k dielectric layer and work function metal layer are planarized to form a metal gate 370 crossing the first fins 160a and the second fins 160b.

The material of the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate (SBT), lead zirconate titanate PZT), barium strontium titanate (BST) or a combination thereof. The high-k dielectric layer can be formed through an atomic layer deposition (ALD) process or a metal-organic chemical vapor deposition (MOCVD) process, but is not limited thereto. The metal gate 370 contains one or a plurality of metal layer such as a work function metal layer, a barrier layer and a low-resistance metal layer. The work function metal layer is formed for tuning the work function of the metal gate 370 to be appropriate in an N-type FinFET device or a P-type FinFET device. For an N-type FinFET device transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a P-type FinFET device transistor, the work function metal layer having a work function ranging between 4.8 eV and 5.2 eV may include titanium nitride (TiN), tantalum nitride (TaN), tantalum carbide (TaC), but it is not limited thereto. The material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

As a result, the passive components 400 including the first fins 160a, and the logic components 410 including the second fins 160b are provided. The source/drains (including the second semiconductor portion 164 and the epitaxial layers 340) of the passive components 400 are connected to the semiconductor substrate 100, and the source/drains (including the second semiconductor portion 164 and the epitaxial layers 340) of the logic components 410 are floating and are spaced from the semiconductor substrate 100 by the spacers 330, 332. The logic components 410 are floating for better A/C performance.

The present disclosure provides a FinFET semiconductor structure including a plurality of P-type FinFET devices and a plurality of N-type FinFET devices. The channel length of the P-type FinFET devices is longer than the channel length of the N-type FinFET devices. The N-type FinFET devices include a plurality of passive components and a plurality of logic components. The logic components are floating, e.g. the logic components and the semiconductor substrate are spaced by spacer, for better A/C performance.

According to some embodiments of the disclosure, a FinFET semiconductor structure is provided. The FinFET semiconductor structure includes a plurality of first fins and second fins extended from a semiconductor substrate, and a gate structure disposed over the first fins and the second fins. Each of the first fins includes a first semiconductor portion connected to the semiconductor substrate and a second semiconductor portion over the semiconductor substrate. Each of the second fins includes the first semiconductor portion connected to the semiconductor substrate, the second semiconductor portion, and at least one spacer at least partially disposed between the first semiconductor portion and the second semiconductor portion. The semiconductor substrate and the first semiconductor portion respectively have a surface oriented on a first crystal plane, the second semiconductor portion has a surface oriented on a second crystal plane, wherein the surfaces oriented on the first crystal plane are substantially parallel to the surface oriented on the second crystal plane, and the first crystal plane is oriented differently than the second crystal plane.

According to some other embodiments of the disclosure, a FinFET semiconductor structure includes a semiconductor having an N-type well and a P-type well, a plurality of first fins disposed on the P-type well, a plurality of second fins disposed on the N-type well, and a gate structure disposed over the first fins and the second fins. Each of the first fins includes a first semiconductor portion connected to the semiconductor substrate and a second semiconductor portion over the semiconductor substrate. Each of the second fins includes the first semiconductor portion connected to the semiconductor substrate and a third semiconductor portion connected to the first semiconductor portion. The semiconductor substrate and the first semiconductor portion respectively have a surface oriented on a first crystal plane, the second semiconductor portion has a surface oriented on a second crystal plane, wherein the surfaces oriented on the first crystal plane are substantially parallel to the surface oriented on the second crystal plane, and the first crystal plane is oriented differently than the second crystal plane.

According to some other embodiments, a method of fabricating a FinFET semiconductor structure is provided. The method includes bonding a second semiconductor substrate onto a first semiconductor substrate, in which the first semiconductor substrate has a surface oriented on a first crystal plane, the second semiconductor substrate has a surface oriented on a second crystal plane, the surface oriented on the first crystal plane is substantially parallel to the surface oriented on the second crystal plane, and the first crystal plane is oriented differently than the second crystal plane. A portion of the second semiconductor substrate is removed thereby exposing a portion of the first semiconductor substrate. A third semiconductor substrate is bonded onto the exposed portion of the first semiconductor substrate, in which the third semiconductor substrate has a surface oriented on the first crystal plane and is substantially parallel to the surface oriented on the second crystal plane. The method further includes patterning the first, second, and third semiconductor substrates, wherein the patterned first and second semiconductor substrates construct a plurality of first fins, and the patterned first and third semiconductor substrate construct a plurality of second fins. A gate structure is formed over the first fins and the second fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A FinFET semiconductor structure, comprising:
a plurality of first fins extended from a semiconductor substrate, each of the first fins comprising a first semiconductor portion connected to the semiconductor substrate, and a second semiconductor portion over the semiconductor substrate;
a plurality of second fins extended from the semiconductor substrate, each of the second fins comprising the first semiconductor portion connected to the semiconductor substrate, the second semiconductor portion, and at least one spacer at least partially disposed between the first semiconductor portion and the second semiconductor portion,
wherein the semiconductor substrate and the first semiconductor portion respectively have a surface oriented on a first crystal plane, the second semiconductor portion has a surface oriented on a second crystal plane, wherein the surfaces oriented on the first crystal plane are substantially parallel to the surface oriented on the second crystal plane, and the first crystal plane is oriented differently than the second crystal plane;
a plurality of epitaxial layers covering the second semiconductor portions of the second fins exposed by the gate structure, wherein the spacers are respectively disposed between the epitaxial layers and the first semiconductor portions; and
a gate structure disposed over the first fins and the second fins.

2. The FinFET semiconductor structure of claim 1, wherein the first crystal plane is a (100) crystal plane.

3. The FinFET semiconductor structure of claim 1, wherein the second crystal plane is a (110) crystal plane, or a (100) crystal plane rotating 45 degrees.

4. The FinFET semiconductor structure of claim 1, wherein the second fins are logic components.

5. The FinFET semiconductor structure of claim 1, further comprising a plurality of epitaxial layers surrounding the second semiconductor portions of the first fins exposed by the gate structure, wherein at least portions of the epitaxial layers connect the second semiconductor portions of the first fins to the first semiconductor portions.

6. The FinFET semiconductor structure of claim 5, wherein the first fins are passive components.

7. The FinFET semiconductor structure of claim 1, further comprising a dielectric material disposed between the first semiconductor portions.

8. A FinFET semiconductor structure, comprising:
a semiconductor substrate having an N-type well and a P-type well;
a plurality of first fins disposed on the P-type well, each of the first fins comprising a first semiconductor portion connected to the semiconductor substrate, and a second semiconductor portion over the semiconductor substrate;
a plurality of second fins disposed on the N-type well, each of the second fins comprising the first semiconductor portion connected to the semiconductor substrate, and a third semiconductor portion connected to the first semiconductor portion,
wherein the semiconductor substrate and the first semiconductor portion respectively have a surface oriented on a first crystal plane, the second semiconductor portion has a surface oriented on a second crystal plane, wherein the surfaces oriented on the first crystal plane are substantially parallel to the surface oriented on the second crystal plane, and the first crystal plane is oriented differently than the second crystal plane;
a plurality of epitaxial layers surrounding the second semiconductor portions of the first fins exposed by the gate structure, wherein at least portions of the epitaxial layers connect the second semiconductor portions of the first fins to the first semiconductor portions of the first fins; and
a gate structure disposed over the first fins and the second fins.

9. The FinFET semiconductor structure of claim 8, wherein a height of the third semiconductor portion is greater than a height of the second semiconductor portion.

10. The FinFET semiconductor structure of claim 8, wherein the third semiconductor portion has a surface oriented on the first crystal plane and being substantially parallel to the surface oriented on the second crystal plane.

11. The FinFET semiconductor structure of claim 8, further comprising a notch disposed on the semiconductor substrate and between the N-type well and the P-type well.

12. The FinFET semiconductor structure of claim 8, further comprising:
a dielectric material disposed on the semiconductor substrate and between the first semiconductor portions; and
a liner disposed between the semiconductor substrate and the dielectric material.

13. A method of fabricating a FinFET semiconductor structure, the method comprising:
bonding a second semiconductor substrate onto a first semiconductor substrate, wherein the first semiconductor substrate has a surface oriented on a first crystal plane, the second semiconductor substrate has a surface oriented on a second crystal plane, the surface oriented on the first crystal plane is substantially parallel to the surface oriented on the second crystal plane, and the first crystal plane is oriented differently than the second crystal plane;
removing a portion of the second semiconductor substrate and exposing a portion of the first semiconductor substrate;
bonding a third semiconductor substrate onto the exposed portion of the first semiconductor substrate, wherein the third semiconductor substrate has a surface oriented on the first crystal plane and being substantially parallel to the surface oriented on the second crystal plane;
patterning the first, second, and third semiconductor substrates, wherein the patterned first and second semiconductor substrates construct a plurality of first fins, and the patterned first and third semiconductor substrate construct a plurality of second fins;
forming a gate structure over the first fins and the second fins;
forming a first oxide layer on a first semiconductor substrate; and
forming a second oxide layer on a second semiconductor substrate, wherein bonding the second semiconductor substrate onto the first semiconductor substrate comprises bonding the first oxide layer and the second oxide layer.

14. The method of claim 13, further comprising:
forming a mask on a first group of the first fins, wherein a second group of the first fins is not covered by the mask;
removing the first oxide layer and the second oxide layer of the second group of the first fins thereby forming at least one gap at the second group of the first fins;
filling a spacer in the gap.

15. The method of claim 14, wherein the spacer is a nitride layer.

16. The method of claim 14, further comprising:
forming a plurality of epitaxial layers covering the second fins and the second group of the first fins.

17. The method of claim 14, further comprising:
removing the mask;
removing the first oxide layer and the second oxide layer of the first group of the first fins; and
forming a plurality of epitaxial layers surrounding the first group of the first fins.

18. The method of claim 17, wherein forming the epitaxial layers comprise connecting the first semiconductor substrate and the second semiconductor substrate with the epitaxial layers.

19. The FinFET semiconductor structure of claim 1, wherein the first and second fins are on the same well of the semiconductor substrate.

20. The FinFET semiconductor structure of claim 8, further comprising:
a third fin disposed on the P-type well and comprising the first and second semiconductor portions; and
a spacer disposed between the first and second semiconductor portions of the third fin.

* * * * *